(12) United States Patent
Lee et al.

(10) Patent No.: US 8,134,145 B2
(45) Date of Patent: Mar. 13, 2012

(54) ORGANIC ELECTRONIC DEVICE

(75) Inventors: Sang Yoon Lee, Seoul (KR); Jung Seok Hahn, Seongnam-si (KR); Kook Min Han, Suwon-si (KR); Bon Won Koo, Suwon-si (KR); Hyun Sik Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 952 days.

(21) Appl. No.: 11/654,585

(22) Filed: Jan. 18, 2007

(65) Prior Publication Data

US 2007/0278481 A1     Dec. 6, 2007

(30) Foreign Application Priority Data

Jun. 2, 2006 (KR) .................. 10-2006-0049947

(51) Int. Cl.
*H01L 51/30* (2006.01)
*H01L 51/40* (2006.01)

(52) U.S. Cl. ........... 257/40; 257/E51.006; 257/E51.038; 438/99

(58) Field of Classification Search .............. 257/40, 257/E51.001–E51.052, E27.117–E27.119; 438/99
See application file for complete search history.

(56) References Cited

U.S. PATENT DOCUMENTS

| | | | | |
|---|---|---|---|---|
| 2003/0160235 A1* | 8/2003 | Hirai | .............. | 257/40 |
| 2004/0161873 A1 | 8/2004 | Dimitrakopoulos et al. | | |
| 2005/0029514 A1* | 2/2005 | Moriya | .............. | 257/40 |
| 2005/0221530 A1* | 10/2005 | Cheng et al. | .............. | 438/82 |
| 2005/0250244 A1* | 11/2005 | Li et al. | .............. | 438/99 |
| 2005/0272212 A1* | 12/2005 | Ho et al. | .............. | 438/301 |
| 2006/0060839 A1* | 3/2006 | Chandross et al. | .............. | 257/40 |
| 2006/0172219 A1* | 8/2006 | Stasiak et al. | .............. | 430/117 |
| 2006/0214156 A1* | 9/2006 | Pan et al. | .............. | 257/40 |
| 2006/0240324 A1* | 10/2006 | Epstein et al. | .............. | 429/212 |
| 2006/0281332 A1* | 12/2006 | Duinveld et al. | .............. | 438/780 |
| 2007/0108480 A1* | 5/2007 | Nanai et al. | .............. | 257/288 |
| 2008/0277648 A1* | 11/2008 | Wakita | .............. | 257/40 |
| 2009/0146134 A1* | 6/2009 | Bo et al. | .............. | 257/40 |
| 2010/0127241 A1* | 5/2010 | Gruner et al. | .............. | 257/20 |

OTHER PUBLICATIONS

Bo, X.-Z., et al. "Carbon Nanotubes-Semiconductor Networks for Organic Electronics: The Pickup Stick Transistor." Appl. Phys. Lett., vol. 86, Article 182102 (2005): pp. 1-3.*
Carroll, D.L., et al. "Polymer-Nanotube Composites for Transparent, Conducting Thin Films." Synth. Met., vol. 155 (2005): pp. 694-697.*
Bo, X.-Z., et al. "Carbon Nanotubes—Semiconductor Networks for Organic Electronics: The Pickup Stick Transistor." Appl. Phys. Lett., vol. 86, Article 182102 (2005): pp. 1-3.*
Bahr, J.L., et al. "Dissolution of Small Diameter Single-Wall Carbon Nanotubes in Organic Solvents?" Chem. Commun. (2001): pp. 193-194.*
Okuzaki, H., et al. "Characteristics of Conducting Polymer Transistors Prepared by Line Patterning." Synth. Met., vol. 137 (2003): pp. 947-948.*
Yoshino, K., et al. "Electrical and Optical Properties of Conducting Polymer—Fullerene and Conducting Polymer—Carbon Nanotube Composites." Fullerene Science and Technology, vol. 7, No. 4 (1999): pp. 695-711.*

* cited by examiner

*Primary Examiner* — Matthew W Such
(74) *Attorney, Agent, or Firm* — Harness, Dickey & Pierce, P.L.C.

(57) ABSTRACT

Disclosed is an organic electronic device, in which a semiconductor layer and source/drain electrodes may be formed from materials of the same type, suitable for a room-temperature wet process, and thus have surface properties similar to each other, thereby decreasing contact resistance between the semiconductor layer and the source/drain electrodes. The materials for formation of the semiconductor layer and source/drain electrodes may be organic semiconductor type materials obtained by adding carbon-based nanoparticles to organic semiconductor materials in predetermined or given amounts. As such, the conductivity of a semiconductor or conductor may vary depending on the amount of carbon-based nanoparticles.

18 Claims, 2 Drawing Sheets

ORGANIC ELECTRONIC DEVICE

PRIORITY STATEMENT

This non-provisional application claims priority under U.S.C. §119 to Korean Patent Application No. 2006-49947, filed Jun. 2, 2006, in the Korean Intellectual Property Office (KIPO), the entire contents of which are herein incorporated by reference.

BACKGROUND

1. Field

Example embodiments relate to an organic electronic device including a semiconductor layer and source/drain electrodes formed from materials of the same type. Other example embodiments relate to an organic electronic device including a substrate, a gate electrode, a gate insulating layer, a semiconductor layer, and source/drain electrodes, in which the semiconductor layer and the source/drain electrodes may be formed using organic semiconductor type materials suitable for a room-temperature wet process, and thus have surface properties similar to each other, thereby decreasing contact resistance between the semiconductor layer and the source/drain electrodes.

2. Description of the Related Art

After the development of polyacetylene, which is a conjugated organic polymer having semiconductor properties, an organic semiconductor is receiving attention as a novel electric and electronic material due to the advantages of organic material, for example, various synthesis methods, easier formability into fibers or films, flexibility, conductivity, and decreased preparation costs, and thus has been studied in the field of functional electronic devices and optical devices. Of devices using such a conductive polymer, research into organic thin film transistors (OTFTs) including a semiconductor layer formed of organic material began in 1980 all over the world.

Compared to conventional silicon thin film transistors, OTFTs are advantageous because a semiconductor layer may be formed through an atmospheric pressure printing process in place of plasma-enhanced chemical vapor deposition (PECVD), and all of the fabrication processes may be carried out using a roll-to-roll process on a plastic substrate, if necessary, thus decreasing the cost of fabricating the transistor. Accordingly, the OTFT may be variously applicable to driving devices of active displays, smart cards and/or plastic chips for inventory tags.

However, the OTFT has increased contact resistance between the semiconductor layer and the source/drain electrodes, amounting to about ones to tens of MΩ, and thus may not be effective for carrier injection, leading to lower charge mobility and higher operating voltage and threshold voltage than in conventional silicon thin film transistors. Adhesion between metal or metal oxide, used in the source/drain electrodes, and organic semiconductor material, used in the semiconductor layer, may be undesirable due to the different surface properties therebetween, and because the metal or metal oxide has a lower work function than the organic semiconductor material, thereby forming a Schottky barrier between the semiconductor layer and the source/drain electrodes.

Methods of surface treating the interface of the semiconductor layer and the source/drain electrodes with a self-assembled monolayer (SAM) compound have been employed. One example of such a method utilizes treating the exposed surface of source/drain electrodes with an SAM compound containing a thiol functional group, so as to increase the charge mobility of the OTFT. However, the above SAM treatment method may be disadvantageous because the procedure thereof may be complicated and may be relatively difficult to apply to a semiconductor line in practice. The metal or metal oxide having surface properties different from those of the organic semiconductor material is normally used for the electrode, and therefore inherent limitations are imposed when attempting to overcome the above problems.

SUMMARY

Example embodiments are provided below for addressing certain of the deficiencies and/or limitations of the related art, and example embodiments provide an organic electronic device, in which both a semiconductor layer and source/drain electrodes may be formed using organic semiconductor type materials suitable for a room-temperature wet process, thus realizing improved adhesion between the semiconductor layer and the source/drain electrodes, resulting in a decrease of contact resistance therebetween.

Example embodiments provide an organic electronic device, including a substrate, a gate electrode, a gate insulating layer, a semiconductor layer, and source/drain electrodes, wherein the semiconductor layer and the source/drain electrodes may be formed using organic semiconductor type materials, obtained by adding carbon-based nanoparticles to organic semiconductor materials in different amounts.

The semiconductor layer may be formed of organic semiconductor type material obtained by adding carbon-based nanoparticles to organic semiconductor material in an amount of about 0.001~0.6 wt % based on the amount of organic semiconductor material, and the source/drain electrodes may be formed of organic semiconductor type material, obtained by adding carbon-based nanoparticles to organic semiconductor material in an amount of about 1.0~10 wt % based on the amount of organic semiconductor material. Example embodiments provide an organic electronic device that may further include at least one selected from the group consisting of data lines and banks.

According to example embodiments a method of fabricating a organic electronic device may include providing a substrate and forming a gate electrode, a gate insulating layer, a semiconductor layer, and source/drain electrodes on the substrate, wherein the semiconductor layer and the source/drain electrodes are formed using organic semiconductor type materials obtained by adding different amounts of carbon-based nanoparticles to organic semiconductor materials.

BRIEF DESCRIPTION OF THE DRAWINGS

Example embodiments will be more clearly understood from the following detailed description taken in conjunction with the accompanying drawings.

FIG. 1 is a diagram illustrating the organic electronic device having a bottom contact structure according to example embodiments;

FIG. 2 is a diagram illustrating the organic electronic device having a top contact structure according to example embodiments;

FIG. 3 is a diagram illustrating the organic electronic device having a top gate structure according to example embodiments;

FIG. 4 is a diagram illustrating the organic electronic device including banks for a semiconductor layer according to example embodiments;

FIG. 5 is a diagram illustrating the organic electronic device including data lines and banks according to example embodiments; and FIG. 6 is a graph showing the current transfer properties of the OTFTs manufactured in Example 1 and Comparative Example 1.

DETAILED DESCRIPTION OF EXAMPLE EMBODIMENTS

Figure 1:
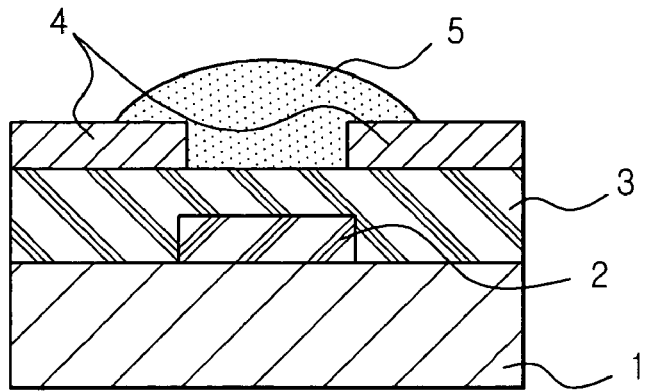
FIGS. 1-6 represent non-limiting, example embodiments as described herein.

Various example embodiments will now be described more fully with reference to the accompanying drawings in which some example embodiments are shown. In the drawings, the thicknesses of layers and regions may be exaggerated for clarity. Detailed illustrative example embodiments are disclosed herein. Specific structural and functional details disclosed herein are merely representative for purposes of describing example embodiments. Example embodiments may, however, be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" and/or "adjacent" versus "directly adjacent").

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, the organic electronic device, including a substrate, a gate electrode, a gate insulating layer, a semiconductor layer, and source/drain electrodes, is characterized in that the semiconductor layer and the source/drain electrodes may be formed using organic semiconductor type materials obtained by adding different amounts of carbon-based nanoparticles to organic semiconductor materials.

In a conventional organic electronic device, source/drain electrodes have been formed using metal, e.g., gold (Au) and/or metal oxide (e.g., indium tin oxide (ITO)). However, because gold (Au), which is disadvantageous because it is expensive and may not adhere to organic semiconductor material, may be formed into an electrode through a vacuum deposition process, a roll-to-roll process may not be easy to apply. ITO may have improved processability, but a work function different by about 0.3 eV or more from the HOMO level of the organic semiconductor material, resulting in undesirable carrier injection. An organic insulator may be damaged upon formation of the electrode through a sputtering process.

Accordingly, example embodiments are intended to solve the above problems by forming the source/drain electrodes and the semiconductor layer using materials of the same type suitable for a room-temperature wet process. Specifically, the semiconductor layer and the source/drain electrodes may be formed using organic semiconductor type materials resulting from the addition of carbon-based nanoparticles to the organic semiconductor materials in different amounts.

Where the carbon-based nanoparticles are mixed with conventional organic semiconductor material and dissolved therein, a simpler and inexpensive room-temperature wet process, for example, spin coating and/or inkjet printing, may be applied, and improved electrical properties, for example, higher charge mobility, may be realized, and furthermore conductivity varying with the amount of carbon-based nanoparticles may be realized. When the carbon-based nanoparticles are added to the organic semiconductor material above a predetermined or given amount, the resulting dispersion may be imparted with conductor properties. When the carbon-based nanoparticles are added below a predetermined or given amount, the resulting dispersion may be imparted with semiconductor properties.

Using the above characteristics in example embodiments, the carbon-based nanoparticles may be added to conventional organic semiconductor materials in different amounts required to confer the conductivities of semiconductor and conductor, after which the resulting materials are used in the semiconductor layer and the source/drain electrodes, respectively. Thereby, the semiconductor layer and the source/drain electrodes may have surface properties similar to each other.

In the organic electronic device including the semiconductor layer and the source/drain electrodes mentioned above, contact resistance may be decreased between the semiconductor layer and the source/drain electrodes due to improved adhesion therebetween. Because it is possible to perform a roll-to-roll process, the semiconductor layer and the source/drain electrodes may be easily and inexpensively manufactured.

As such, the amount of carbon-based nanoparticles, which varies depending on the kind of organic semiconductor material, may be appropriately determined by those skilled in the art, so as to exhibit the conductivity of a semiconductor or conductor. Specifically, when forming the semiconductor layer, the carbon-based nanoparticles may be added to the organic semiconductor material in an amount of about 0.001~0.6 wt %, and about 0.1~0.4 wt %, based on the amount of organic semiconductor material. When forming the source/drain electrodes, the carbon-based nanoparticles may be added to the organic semiconductor material in an amount of about 1.0~10 wt %, and about 1.5~5 wt %, based on the amount of organic semiconductor material.

The organic semiconductor materials for the semiconductor layer and the source/drain electrodes, respectively, may be used without limit as long as they are typically known organic semiconductor materials, and may be the same as or different from each other. For example, polythiophene material may be used as the organic semiconductor materials for both the semiconductor layer and the source/drain electrodes, while pentacene may be used as the organic semiconductor material for the semiconductor layer and polythiophene material may be used as the organic semiconductor material for the source/drain electrodes. Among organic semiconductor materials, which are similar with respect to properties, e.g., work function and improved adhesion, desired materials may be appropriately selected and may be the same material.

The carbon-based nanoparticles for the semiconductor layer and the source/drain electrodes, respectively, may be used without limit as long as they are typically known materials based on a carbon component and may be nanosized. These particles may also be the same as or different from each other, but the same particles may be adopted. The organic semiconductor materials for the semiconductor layer and the source/drain electrodes, respectively, may be the same, and also that the carbon-based nanoparticles therefore may be the same.

Specifically, the organic semiconductor material usable in example embodiments may include at least one selected from the group consisting of known lower-molecular-weight or oligomer organic semiconductor materials and known polymer organic semiconductor materials, depending on the choice of those skilled in the art. For example, anthracene, tetracene, pentacene, oligothiophene, polythiophene, merocyanine, copper phthalocyanine, perylene, polyaniline, polyacetylene, polypyrrole, polyphenylene, rubrene, coronene, anthradithiophene, polyfluorene, polyphenylenevinylene, polythienylthiazole and/or derivatives thereof may be used alone or in combinations thereof, but example embodiments may not be limited thereto.

The carbon-based nanoparticles usable in example embodiments may include at least one selected from the group consisting of carbon nanotubes, fullerene, graphite, and carbon black, depending on the choice of those skilled in the art. Carbon nanotubes and/or fullerene may be used, for example, carbon nanotubes having both semiconductor properties and metallic properties may be useful.

As such, examples of the carbon nanotubes may include single-walled carbon nanotubes, double-walled carbon nanotubes, multi-walled carbon nanotubes, and rope carbon nanotubes, which may be used alone or in combinations thereof. Of these carbon nanotubes, single-walled carbon nanotubes may be used because the mobility thereof may increase due to the increased volume density (surface area) thereof. The carbon-based nanoparticles may have a particle size of about ones to tens of nm, but example embodiments may not be limited thereto. The semiconductor layer or the source/drain electrodes may be formed by dissolving and dispersing the corresponding organic semiconductor type material in an organic solvent to make a mixture and applying the mixture to the semiconductor layer or the source/drain electrodes.

As the organic solvent, a typical organic solvent may be used without limit, and may be exemplified by alcohols, such as methyl alcohol, ethyl alcohol, n-propyl alcohol, isopropyl alcohol, n-butyl alcohol, sec-butyl alcohol, t-butyl alcohol, isobutyl alcohol, and diacetone alcohol, ketones, such as acetone, methylethylketone, and methylisobutylketone, glycols, such as ethyleneglycol, diethyleneglycol, triethyleneglycol, propyleneglycol, butyleneglycol, hexyleneglycol, 1,3-propanediol, 1,4-butanediol, 1,2,4-butanetriol, 1,5-pentanediol, 1,2-hexanediol, and 1,6-hexanediol, glycol ethers, such as ethyleneglycol monomethyl ether and triethyleneglycol monoethyl ether, glycol ether acetates, such as propyleneglycol monomethyl ether acetate (PGMEA), acetates, such as ethyl acetate, butoxyethoxy ethyl acetate, butyl carbitol acetate (BCA), and dihydroterpineol acetate (DHTA), terpineols, trimethyl pentanediol monoisobutyrate (TEXANOL), dichloroethene (DCE), chlorobenzene, and N-methyl-2-pyrrolidone (NMP), which may be used alone or in combinations thereof. A solvent system or solvent mixture of two or more of the solvents in any miscible ratio may also be used.

As such, the organic semiconductor type material may be added in such a manner that the organic semiconductor material constituting the organic semiconductor type material has a concentration of about 0.1~20 wt % in the organic solvent, in the interest of dispersibility and solubility. The process of dissolving and dispersing the organic semiconductor type material may not be particularly limited, but may be appropriately conducted depending on the choice of those skilled in the art. The above process may be performed at about 30~60° C. for about 0.5~5 hours. When the dissolution and dispersion are conducted at a temperature less than about 30° C., the organic semiconductor material may solidify over time and thus the dissolution effect may not be exhibited. When the dissolution and dispersion are conducted at a temperature higher than about 60° C., the semiconductor properties of the organic semiconductor material may be negatively affected.

With the goal of increasing the solubility of the semiconductor type material and stabilizing the dispersion state of the carbon-based nanoparticles, a predetermined or given acid or base may be added in an appropriate amount, or ultrasonic treatment may be conducted, within a range that may not inhibit the purpose of example embodiments. Also, at least one additive selected from among an organic binder, a photosensitive monomer, a photoinitiator, a viscosity controller, a storage stabilizer, and a wetting agent may be further added, depending on the judgment of those skilled in the art. As the other additive, e.g., a dispersant, a typical material known in the field of conventional organic electronic devices may be used without limit.

As the coating process, a typical room-temperature wet process may be used without limit, and may include printing, spin coating, solution casting, screen printing, dip coating, inkjet printing and/or drop casting. A spin coating process and/or an inkjet printing process may be used in the interest of convenience and uniformity. When conducting a spin coating process, the spinning speed may be controlled within a range from about 100 to 10,000 rpm. The semiconductor layer and the source/drain electrodes thus formed may be about 300~2,000 Å thick and about 500~2,000 Å thick, respectively, and may be patterned using a typical process. The substrate included in the organic electronic device of example embodiments may not be particularly limited within a range that does not inhibit the purpose of example embodiments, and may be selected from among silica, glass and plastic, depending on the choice of those skilled in the art. Examples of the plastic substrate may include, but are not limited to, polyethylene naphthalate, polyethylene terephthalate, polycarbonate, polyvinylalcohol, polyacrylate, polyimide, polynorbornene, and polyethersulfone.

The gate electrode included in the organic electronic device of example embodiments may be formed using a typical material, for example, at least one selected from among metals, such as gold (Au), silver (Ag), aluminum (Al), nickel (Ni), molybdenum (Mo), tungsten (W), chromium (Cr) and/or alloys thereof (e.g.; Mo/W alloy), metal oxides, such as indium tin oxide (ITO) and indium zinc oxide (IZO) and/or conductive polymers, copolymers or higher order polymers, such as polythiophene, polyaniline, polyacetylene, polypyrrole, polyphenylene vinylene, and a mixture of PEDOT (polyethylenedioxythiophene) and PSS (polystyrenesulfonate). The gate electrode may be about 500~2,000 Å thick, and may be patterned through a typical process.

The gate insulating layer may be formed using a typical insulator having a higher dielectric constant. Specifically, a ferroelectric insulator, an inorganic insulator, an organic insulator and/or a composition including an aqueous polymer solution, having a UV curing agent added thereto, and a fluorine-based aqueous compound may be used, but example embodiments may not be limited thereto. Examples of a ferroelectric insulator may be selected from among $Ba_{0.33}Sr_{0.66}TiO_3$(BST), $Al_2O_3$, $Ta_2O_5$, $La_2O_5$, $Y_2O_3$ and $TiO_2$, an inorganic insulator selected from among $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$ and AlON, or an organic insulator selected from among polyimide, benzenecyclobutene (BCB), parylene, polyacrylate, polyvinyl alcohol and/or polyvinyl phenol.

A composition including a UV curing agent-added aqueous polymer solution and a fluorine-based aqueous compound may be adopted. Upon the use of such a composition, patterning may be realized without the need for an etching process using a photoresist, thus forming a gate insulating layer in which insulating properties, e.g., hysteresis, may be improved. Although the composition is not particularly limited, the UV curing agent may be contained in the aqueous polymer solution in a ratio of about 0.01:1~0.05:1 based on the solid content, and the fluorine-based aqueous compound may be contained in the UV curing agent-added aqueous polymer solution in a ratio of about 0.1:1~1:1 based on the solid content. The aqueous polymer solution may be obtained by dissolving about 1~20 wt % of aqueous polymer in deionized water.

The UV curing agent may include at least one selected from among ammonium dichromate, pentaerythritol triacrylate, and urethane acrylate, and the aqueous polymer may include at least one selected from among polyvinylalcohol, polyvinyl chloride, polyacryl amide, polyethylene glycol, polyethylene oxide, polymethylvinyl ether, polyethylene imine, polyphenylene vinylene, polyaniline, polypyrrole, copolymers thereof and mixtures thereof.

The fluorine-based aqueous compound may include at least one selected from among fluoroalkane and derivatives thereof, perfluoroalkylalcohol ethylene oxide and derivatives thereof, perfluoroalkyl carboxylic acid and salts thereof, perfluoroalkyl sulfonic acid and salts thereof, perfluoroalkyloxy benzene sulfonic acid and salts thereof, perfluoroalkyl benzene sulfonic acid and salts thereof, perfluoroalkylamine and salts thereof, perfluoroalkyl sulfone amide and salts thereof, ammonium fluoride, monoethanol amine fluoride, tetramethyl ammonium fluoride and mixtures thereof.

The formation of the gate insulating layer using the above composition is performed by applying the composition through a typical coating process, drying it through a typical process, and conducting UV irradiation and development. As such, the UV irradiation is not particularly limited but is carried out at a wavelength of about 340~400 nm using a lamp having power of about 300~500 W for about 10~180 sec, and the development may be performed at about room temperature for about 1~5 min using deionized water. A baking process, which may also be conducted if necessary, may proceed at about 50~150° C. for about 0.5~2 hours on a hot plate.

The gate insulating layer may be about 1,000~7,000 Å thick, but example embodiments may not be limited thereto, and also the gate insulating layer may be patterned through a typical process. The organic electronic device of example embodiments may further include data lines and/or banks. The data line may be formed using metal or metal oxide, known in the field of conventional electronic devices without limit. Specifically, metals, such as gold, silver, aluminum, nickel, molybdenum, tungsten, and chromium, or alloys thereof, and metal oxides, such as no and IZO, may be used alone or in combinations thereof. The data line may be formed using a typical process known in the field of conventional electronic devices without limit, and may not be particularly limited, but may have a thickness of about 1,000~3,000 Å.

Banks for a semiconductor layer and banks for source/drain electrodes may be provided, either or both of which may be included. The bank may be formed through a typical process using a bank-formation material known in the field of conventional electronic devices without limit, and may be formed of the composition including the UV curing agent-added aqueous polymer and the fluorine-based aqueous compound. The description for the composition and bank formation process may be the same as in the gate insulating layer, and may be thus omitted.

The thickness of the bank, which varies depending on the thickness of the semiconductor layer or source/drain electrodes, may be appropriately determined according to the choice of those skilled in the art, and may be in the range from about 3,000 Å to about 2 μm, but example embodiments are not limited thereto. The organic electronic device of example embodiments may include all of the data lines, the banks for a semiconductor layer, and the banks for source/drain electrodes. The organic electronic device of example embodiments may have a bottom contact structure, a top contact structure and/or a top gate structure.

Figure 2:
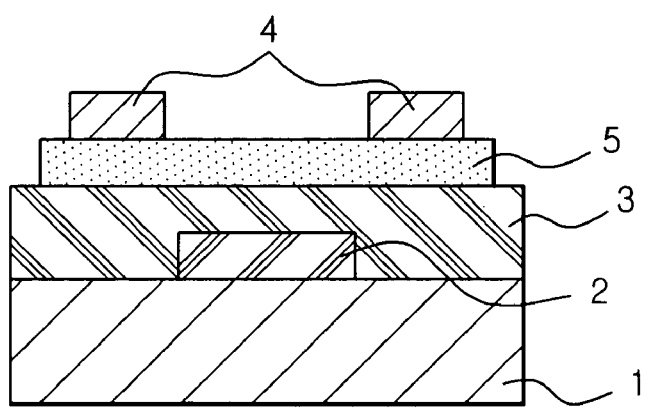
Figure 3:
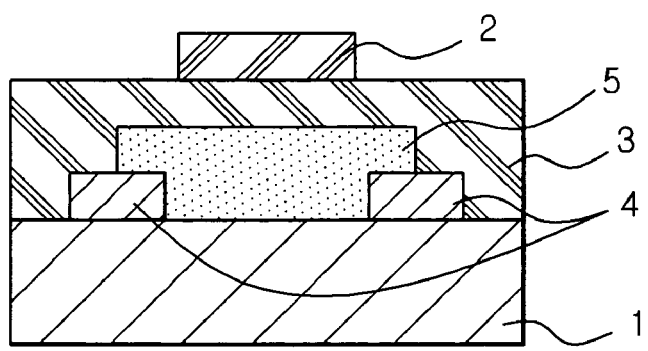

Specifically, as shown in FIG. 1, the organic electronic device of example embodiments may have a bottom contact structure, including a substrate 1, a gate electrode 2 positioned on the substrate, a gate insulating layer 3 positioned on the gate electrode, source/drain electrodes 4 positioned on the gate insulating layer and a semiconductor layer 5 positioned on the gate insulating layer and the source/drain electrodes. As shown in FIG. 2, the organic electronic device of example embodiments may have a top contact structure, including a substrate 1, a gate electrode 2 positioned on the substrate, a gate insulating layer 3 positioned on the gate electrode, a semiconductor layer 5 positioned on the gate insulating layer and source/drain electrodes 4 positioned on the semiconductor layer. As shown in FIG. 3, there may be provided a top gate structure, including a substrate 1, source/drain electrodes 4 positioned on the substrate, a semiconductor layer 5 positioned on the substrate and the source/drain electrodes, a gate insulating layer 3 positioned on the semiconductor layer and a gate electrode 2 positioned on the gate insulating layer.

Figure 4:
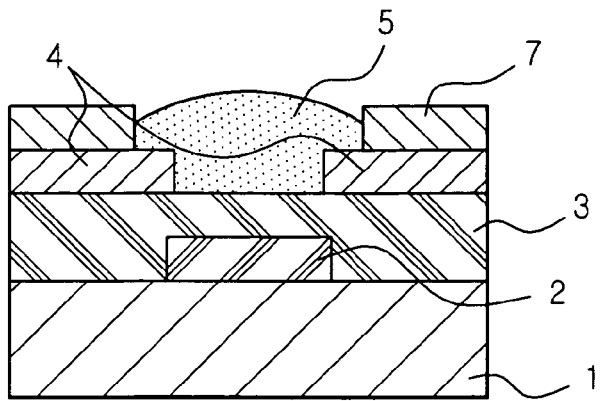
Figure 5:
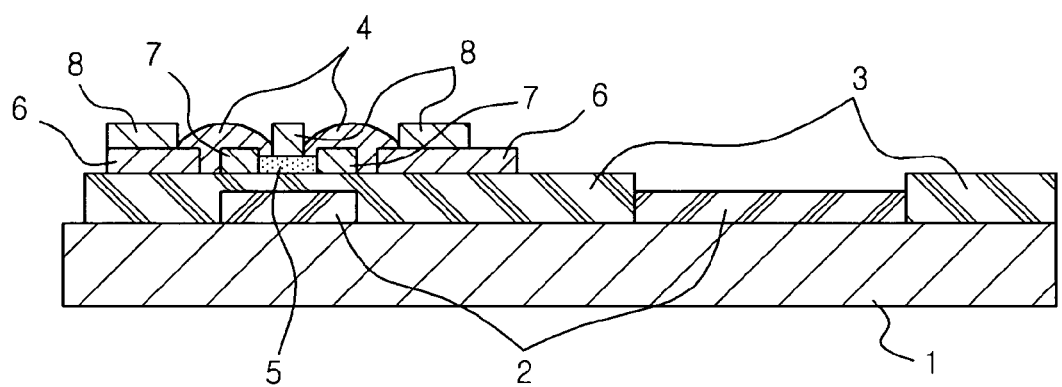

The structure may further include banks 7 for a semiconductor layer on the source/drain electrodes 4, as seen in FIG. 4, and may further include data lines 6, banks 7 for a semiconductor layer, and banks 8 for source/drain electrodes, as seen in FIG. 5, but example embodiments are not limited thereto. The structure may be modified within a range that may not inhibit the purpose of example embodiments. Examples of the organic electronic device may include, but are not limited to, thin film transistors, field emission devices, solar cells and/or polymer memory.

In the organic electronic device of example embodiments, the semiconductor layer and the source/drain electrodes may be formed using materials of the same type, obtained by adding predetermined or given amounts of carbon-based nanoparticles to the organic semiconductor materials. Thereby, a simple and inexpensive room-temperature wet process may be performed, and as well, contact resistance between the semiconductor layer and the source/drain electrodes may be decreased, leading to improved electrical properties, including higher charge mobility. Therefore, the organic electronic device of example embodiments may be effectively applied to various display devices, which are exemplified by liquid crystal displays, plasma displays, field emission displays, light emitting diodes and/or organic EL displays, but example embodiments are not limited thereto.

A better understanding of example embodiments may be obtained in light of the following examples which are set forth to illustrate, but are not to be construed to limit example embodiments.

Example 1

A polythiophene polymer (MW about 10,000~50,000) was dissolved to a concentration of about 1 wt % in chlorobenzene at about 45° C., after which single-walled carbon nanotubes were added thereto in an amount of about 0.2 wt % based on the amount of polythiophene polymer, and dispersed for about 3 hours through ultrasonic treatment, thus preparing an organic semiconductor material solution A. Separately, an organic semiconductor material solution B was prepared through the same procedure as above, with the exception that single-walled carbon nanotubes were added in an amount of about 1.5 wt % based on the amount of polythiophene polymer.

On a washed glass substrate, Mo/W alloy was deposited to a thickness of about 1,000 Å using a sputtering process, thus forming a gate electrode. Subsequently, $SiO_2$ was deposited to a thickness of about 3,000 Å on the gate electrode through CVD, thus forming a gate insulating layer. Thereafter, the organic semiconductor material solution A was applied to a thickness of about 1,000 Å on the gate insulating layer using a spin coating process at about 2,000 rpm, and then baked at about 100° C. for about 10 min in an argon atmosphere, thus forming a semiconductor layer. Subsequently, the procedure of forming banks for source/drain electrodes on the above organic semiconductor material solution was carried out as follows.

A solution of polyvinyl alcohol (#2000, available from Kanto Chemical Co.), dissolved to a concentration of about 5 wt % in deionized water, was added with ammonium dichromate (available from Sigma Aldrich) in a ratio of about 1:0.03 based on the solid content. The resulting solution was added with fluoroalkane (Zonyl Dupont®) in a ratio of about 1:0.3 based on the volume, after which the solution thus obtained was subjected to spin coating at about 1,000 rpm and then dried in air. Subsequently, the surface was irradiated with a UV lamp having about 400 W/cm$^3$ at a wavelength of about 370 nm for about 180 sec, developed at room temperature for about 3 min using deionized water, and then baked at about 200° C. for about 1 hour on a hot plate, thus forming banks for source/drain electrodes at about 5,000 Å.

Thereafter, the organic semiconductor material solution B was applied to a thickness of about 1,000 Å using an inkjetting process and then baked at about 100° C. for about 10 min in an argon atmosphere, thus forming source/drain electrodes. Thereby, the OTFT of example embodiments was completed.

Comparative Example 1

An OTFT was manufactured in the same manner as in Example 1, with the exception that the semiconductor layer was formed using only the polythiophene polymer (MW about 1,000~50,000), and the source/drain electrodes were formed using gold (Au).

Figure 6:
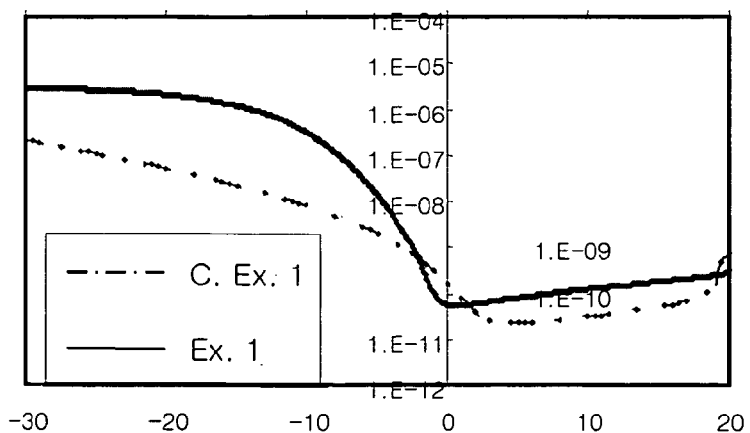

The current transfer properties of the OTFTs of Example 1 and Comparative Example 1 were measured. The results are shown in FIG. 6. As is apparent from FIG. 6, it was confirmed that the OTFT of Example 1 had improved adhesion between the semiconductor layer and the source/drain electrodes than the OTFT of Comparative Example 1, thus contact resistance was decreased therebetween, and consequently current was increased and improved current transfer properties were exhibited near the threshold voltage.

As described hereinbefore, example embodiments provide an organic electronic device including a semiconductor layer and source/drain electrodes formed from materials of the same type. In the organic electronic device of example embodiments, because the semiconductor layer and the source/drain electrodes may be formed using materials of the same type to be suitable for a room-temperature wet process, they may have surface properties similar to each other. Thereby, contact resistance between the semiconductor layer and the source/drain electrodes may be decreased, and the semiconductor layer and the source/drain electrodes may be easily and inexpensively formed through a roll-to-roll process.

Although example embodiments have been disclosed for illustrative purposes, those skilled in the art will appreciate that various modifications, additions and substitutions are possible, without departing from the scope and spirit of the accompanying claims.

What is claimed is:

1. An organic electronic device, comprising a substrate, a gate electrode, a gate insulating layer, a semiconductor layer, and source/drain electrodes,
    wherein the semiconductor layer and the source/drain electrodes include organic semiconductor type materials having different concentrations of carbon-based nanoparticles and organic semiconductor materials,
    wherein the carbon-based nanoparticles and the organic semiconductor materials are the same in the semiconductor layer and the source/drain electrodes, and
    wherein the organic semiconductor materials include at least one selected from the group consisting of anthracene, tetracene, pentacene, oligothiophene, polythiophene, merocyanine, copper phthalocyanine, perylene, polyaniline, polyacetylene, polypyrrole, polyphenylene, rubrene, coronene, anthradithiophene, polyfluorene, polyphenylenevinylene, and polythienylthiazole.

2. The device as set forth in claim 1, wherein the semiconductor layer is formed of a first organic semiconductor type material obtained by adding the carbon-based nanoparticles to the organic semiconductor material in an amount of about 0.001~0.6 wt % based on an amount of the organic semiconductor material, and the source/drain electrodes are formed of a second organic semiconductor type material obtained by adding the carbon-based nanoparticles to the organic semiconductor material in an amount of about 1.0~10 wt % based on an amount of the organic semiconductor material.

3. The device as set forth in claim 1, wherein the organic semiconductor materials include at least one selected from the group consisting of low-molecular-weight or oligomer organic semiconductor materials and polymer organic semiconductor materials.

4. The device as set forth in claim 1, wherein the carbon-based nanoparticles include at least one selected from the group consisting of carbon nanotubes, fullerene, graphite, and carbon black.

5. The device as set forth in claim 1, wherein the carbon-based nanoparticles are carbon nanotubes, the carbon nanotubes being selected from the group consisting of single-walled carbon nanotubes, double-walled carbon nanotubes, multi-walled carbon nanotubes, and rope carbon nanotubes.

6. The device as set forth in claim 1, wherein the carbon-based nanoparticles have a particle size from about ones to tens of nm.

7. The device as set forth in claim 1, wherein the substrate is selected from the group consisting of a silicon substrate, a glass substrate, and a plastic substrate.

8. The device as set forth in claim 1, wherein the gate electrode includes at least one material selected from the group consisting of metals or alloys thereof, metal oxides, and conductive polymers.

9. The device as set forth in claim 1, wherein the gate insulating layer includes a ferroelectric insulator, an inorganic insulator, an organic insulator, or a composition including an aqueous polymer solution, having a UV curing agent added thereto, and a fluorine-based aqueous compound.

10. The device as set forth in claim 1, further comprising:
    at least one selected from the group consisting of a data line and a bank.

11. The device as set forth in claim 10, further comprising the data line, wherein the data line includes at least one selected from the group consisting of metals or alloys thereof, and metal oxides.

12. The device as set forth in claim 10, further comprising the bank, wherein the bank includes at least one selected from the group consisting of banks for a semiconductor layer and banks for source/drain electrodes.

13. The device as set forth in claim 1, wherein the organic electronic device is selected from the group consisting of a thin film transistor, a field emission device, a solar cell, and polymer memory.

14. A method of fabricating an organic electronic device, comprising:
    providing a substrate; and
    forming a gate electrode, a gate insulating layer, a semiconductor layer, and source/drain electrodes on the substrate,
    wherein the semiconductor layer and the source/drain electrodes are formed using organic semiconductor type materials obtained by adding different concentrations of carbon-based nanoparticles to organic semiconductor materials,
    wherein the carbon-based nanoparticles and the organic semiconductor materials are the same in the semiconductor layer and the source/drain electrodes, and
    wherein the organic semiconductor materials include at least one selected from the group consisting of anthracene, tetracene, pentacene, oligothiophene, polythiophene, merocyanine, copper phthalocyanine, perylene, polyaniline, polyacetylene, polypyrrole, polyphenylene, rubrene, coronene, anthradithiophene, polyfluorene, polyphenylenevinylene, and polythienylthiazole.

15. The method as set forth in claim 14, wherein the method of forming the semiconductor layer and the source/drain electrodes further comprises:
    dissolving and dispersing the organic semiconductor type material in an organic solvent to make a mixture; and
    applying the mixture to the semiconductor layer and the source/drain electrodes.

16. The method as set forth in claim 15, wherein the organic solvent includes at least one selected from the group consisting of alcohols, glycols, glycol ethers, glycol ether acetates, terpineols, trimethyl pentanediol monoisobutyrate (TEXANOL), dichloroethene (DCE), chlorobenzene, N-methyl-2-pyrrolidone (NMP) and mixtures thereof.

17. The method as set forth in claim 15, wherein dissolving and dispersing the organic semiconductor type material is conducted at about 30~60° C. for about 0.5~5 hours.

18. The method as set forth in claim 15, wherein applying the mixture is conducted through a coating process selected from the group consisting of printing, spin coating, solution casting, screen printing, dip coating, ink jetting, and drop casting.

* * * * *